United States Patent
Maheshwari

(10) Patent No.: US 6,665,847 B1
(45) Date of Patent: Dec. 16, 2003

(54) ACCURATE AND REALISTIC CORNER CHARACTERIZATION OF STANDARD CELLS

(75) Inventor: Dinesh Maheshwari, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 81 days.

(21) Appl. No.: 09/972,131

(22) Filed: Oct. 5, 2001

(51) Int. Cl.$^7$ .............................................. G08F 17/50
(52) U.S. Cl. .................................................. 716/5; 347/9
(58) Field of Search ............................ 716/2, 5, 6, 17; 347/9

(56) References Cited

U.S. PATENT DOCUMENTS

| | | | |
|---|---|---|---|
| 5,446,676 A | 8/1995 | Huang et al. ................. 364/578 |
| 5,553,008 A | 9/1996 | Huang et al. ................. 364/578 |
| 5,692,160 A | 11/1997 | Sarin ........................... 395/500 |
| 5,790,436 A | 8/1998 | Chen et al. .................. 364/578 |
| 5,838,947 A | 11/1998 | Sarin ........................... 395/500 |
| 5,852,379 A | 12/1998 | Jiang ............................ 327/176 |
| 5,880,967 A | 3/1999 | Jyu et al. ..................... 364/489 |
| 6,018,623 A | 1/2000 | Chang et al. ........... 395/500.07 |
| 6,163,475 A | 12/2000 | Proebsting ................... 365/63 |
| 6,209,122 B1 | 3/2001 | Jyu et al. ...................... 716/6 |
| 6,330,704 B1 | 12/2001 | L.jung et al. .................. 716/5 |
| 6,390,579 B1 * | 5/2002 | Roylance et al. .............. 347/9 |
| 6,397,170 B1 | 5/2002 | Dean et al. .................... 703/14 |
| 6,493,853 B1 * | 12/2002 | Savithri et al. ................. 716/5 |
| 6,503,774 B2 | 1/2003 | Tsai .............................. 438/39 |

* cited by examiner

Primary Examiner—Matthew Smith
Assistant Examiner—Thuan Do
(74) Attorney, Agent, or Firm—Wagner, Murabito & Hao LLP

(57) ABSTRACT

A memory resident circuit cell model for characterizing an integrated circuit cell. The present invention comprises a first aggregate value representing a best case corner and a second aggregate value representing a worst case corner. In the present embodiment, the first and second aggregate value comprise a first delay representation accounting for timing variations of the cell relative to cross-coupling within the cell and a second delay representation accounting for timing variations of the cell relative to over-the-cell-routing-coupling. The first and second aggregate value further comprise a third delay representation accounting for timing variations of the cell for pin-input-capacitance and a fourth delay representation accounting for timing variations of the cell relative to delays due to near simultaneous input switching. The first and second aggregate value further comprise a fifth delay representation accounting for timing variations of the cell relative to interdependent set up, hold, delay variations for sequential cells.

24 Claims, 15 Drawing Sheets

ACCURATE AND REALISTIC CORNER CHARACTERIZATION OF STANDARD CELLS

FIELD OF THE INVENTION

The present invention relates to integrated circuit fabrication using, in part, standard cell corner characterization. More particularly, the present invention provides a method for providing accurate and realistic corner characterization of standard cells utilized in the fabrication of integrated circuits.

BACKGROUND OF THE INVENTION

In the field of integrated circuit fabrication, it is necessary to design and test the integrated circuit before any production of the integrated circuit is initiated. Until recently, that process required the designers to physically build the integrated circuit and install that circuit into the device with which the circuit was to interact. By requiring the physical fabrication and installation, this process was a slow, laborious, and expensive method of testing the integrated circuit's functionality.

Fortunately, advances in computer technology and developments in related software now provide the tools which enable a designer to design integrated circuits and to test those circuits using software equivalents or models of that particular circuit. A circuit, in part, is a collection of elements such as, e.g., AND gates, flip-flops, mux's (multiplexers), and slightly larger XOR and XAND gates. These elements, in turn, contain the transistors that comprise the design.

In an IC (integrated circuit) design, for example, those design circuits commonly consist of millions of transistors, and as such it is difficult to represent those millions of transistors as separate entities. Therefore, to alleviate the lengthy process of separately testing the elements within the design of the circuit, the IC industry has created software standard cell libraries. Standard cell libraries contain the many different standard cells which are utilized in the design of the circuits. A standard cell is a computer and software representation or model of a particular element or component of the circuit being designed. Each standard cell in the standard cell library is characterized by an abstraction. The abstraction is a behavioral description of the timing data of that cell. Circuit abstractions are used by software simulator tools for measuring circuit behavior, such as timing, etc.

ASIC (application specific integrated circuit) design methodology, for example, uses cells from one or more standard cell libraries as building blocks. Each cell in the library has a set of representations corresponding to the functionality, timing, and layout abstraction for the cell. In a synchronous design style supported by ASIC design methodology, successful timing operation of the design can be insured for all timing variations if, during simulation, the design works for, what the industry has termed, the worst-case timing scenario and the best-case timing scenario for the constituting cells. As such, a timing representation of the cell is required to contain at least the worst-case and best-case delay values for an input/inout and output/inout path of the cell. This enables a verification of the design operation for the worst-case and the best-case timing for the cells in a design.

The prevailing standard in the industry is to obtain, with regard to circuit verification, the worst-case and best-case timing values for the worst-case PVT (process, voltage, temperature) corner and the best-case PVT corner. In effect, circuit performance varies based on variations in the process, voltage and temperature of the circuit. In one example, current methodologies accomplish this by averaging the data with regard to PVT in a best-case and a worst-case scenario, and inserting those figures into the abstraction to obtain the necessary timing value scenarios. As such, because the abstraction is based on averages, the best-case scenario is not necessarily the actual best-case and the worst-case scenario is not necessarily the actual worst-case scenario.

In addition, this prevailing industry standard for circuit modelling does not take into account standard cell abstraction variations. Included in the abstraction variations not taken into account, in addition to the actual worst and best case PVT corners, are cross-coupling-within-the-cell variations, over-the-cell-routing-coupling variations, pin-input-capacitance-variations and the associated delay-variation-due-to-near-simultaneous-input-switching variations, and setup-hold-delay variations regarding sequential cells.

With regard to cross-coupling-within-the-cell variations, current methodologies utilize a K-factor for the cross coupling that is considered to be between the possible values of 1.0 and 2.0. Since this is neither the best or worst case scenario, the extractions based upon these numbers will not be the best or worst case scenario.

With regard to over-the-cell-routing-coupling variations, the capacitive loading due to over the cell routing is, in current methodologies, either not accounted for or is reflected as maximum routing for both worst and best case timing. Even when maximum over the routing is accounted for, the K-factor is taken to be an average value between 1.0 and 2.0. As such, since an average is utilized, the best and worst case timing scenarios are not the actual best and worst case scenarios.

With regard to pin-input-capacitance-variations and the associated delay-variation-due-to-near-simultaneous-switching, the input capacitance of an input/inout pin of the cell varies with the direction and the slope of the transition on the pin. The current methodology captures the input capacitance as an average value. Additionally, cell timing can vary in response to the transition direction on other signals. Also affecting cell timing is the temporal proximity of the those transitions. The current methodology accounts for delays caused by single input transitions only for both the worst and best case timing. Because multiple input transitions are not addressed, the best and worst case timing scenarios are not the actual best and worst case scenarios.

With regard to the setup-hold-delay variations regarding sequential cells, the delay through sequential cells varies inversely with the time for which the data has been setup before the clock. The current methodology does not account for this variation.

The prevailing industry standard for circuit modelling does not account for these non-PVT abstractions and therefore does not reflect the real worst-possible-case and best-possible-case timing values. This means that a design verified to work for the worst-case and the best-case as obtained by the current industry standard methodologies can still result in failures in silicon.

Therefore, a need exists for a method of corner characterization of standard cells that provides a model that offers a more accurate and realistic corner characterization. Another need exists for a method that includes an accurate best-case timing scenario in the corner characterization of the standard cell. A further need exists for a method that includes an accurate worst-case timing scenario in the corner characterization of the standard cell.

SUMMARY OF THE INVENTION

Thus a need exists for a circuit cell model that achieves improved corner characterization of standard cells. Another need exists for a circuit cell model that fills the above need and which takes into account abstraction variables that are currently not being included in the characterization. A further need exists for a circuit cell model that fills the above needs and which includes an accurate best-case timing scenario in the corner characterization of the standard cell. An additional need exists for a circuit cell model that fills the above needs and which includes an accurate worst-case timing scenario in the corner characterization of the standard cell. These and other objects and advantages of the present invention will no doubt become obvious to those of ordinary skill in the art after having read the following detailed description of the preferred embodiments which are illustrated in the various drawing figures.

Accordingly, the present invention provides a memory resident circuit cell model for improved corner characterization of standard cells. The present invention further provides a memory resident circuit cell model that achieves the above listed advantages, and which accounts for timing variations not previously taken into account. Further, the present invention also provides a memory resident circuit cell model method which achieves the above advantages, and which further includes an accurate best-case timing scenario in the corner characterization of the standard cell. Additionally, the present invention provides a memory resident circuit cell model which achieves the above advantages, and which further includes an accurate worst-case timing scenario in the corner characterization of the standard cell.

More specifically, the present invention provides a memory resident circuit cell model for characterizing an integrated circuit cell. The present invention comprises a first aggregate value representing a best case corner and a second aggregate value representing a worst case corner. In the present embodiment, the first and second aggregate value comprise a first delay representation accounting for timing variations of the cell relative to cross-coupling within the cell and a second delay representation accounting for timing variations of the cell relative to over-the-cell-routing-coupling. The first and second aggregate value further comprise a third delay representation accounting for timing variations of the cell for pin-input-capacitance and a fourth delay representation accounting for timing variations of the cell relative to delays due to near simultaneous input switching. The first and second aggregate value further comprise a fifth delay representation accounting for timing variations of the cell relative to interdependent set up, hold, delay variations for sequential cells.

As a result of the above considerations, embodiments of the present invention provide accurate and realistic circuit models that can be used for improved circuit simulation and behavior analysis. When applied to standard cell libraries, the present invention enables more realistic modelling and characterization of the standard cells in a library, thereby reducing the probability of errors in silicon for design using standard cell based methodologies.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1A:
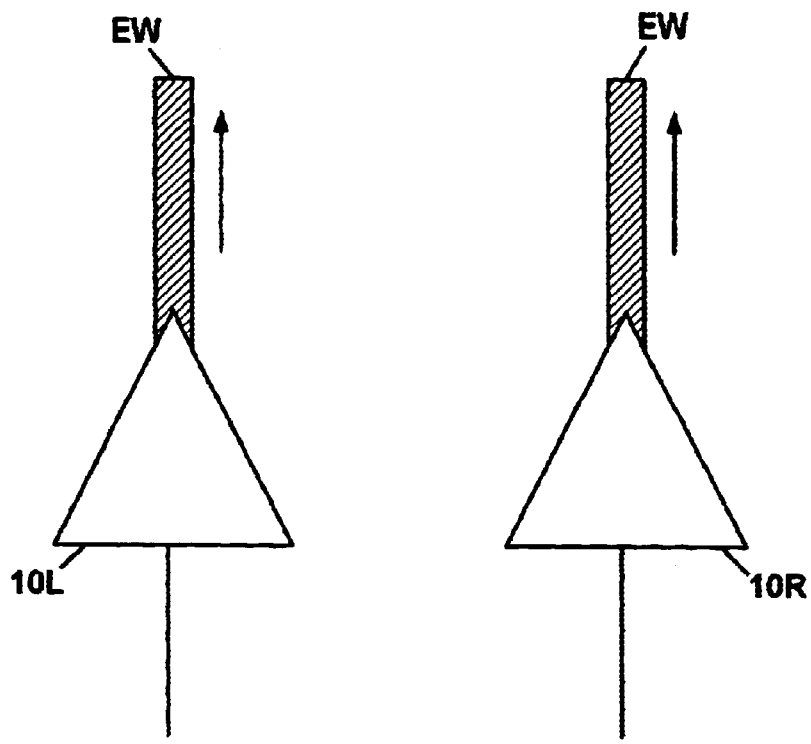
FIG. 1A is an illustration of elements of design shown as having coupling wires oriented such that they are in a supporting configuration, in accordance with one embodiment of the present invention.

A method for a more accurate and realistic corner characterization of standard cells is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Notation and Nomenclature

Some portions of the detailed descriptions, which follow, are presented in terms of procedures, steps, logic blocks, processing, and other symbolic representations of operations on data bits that can be performed on computer memory. These descriptions and representations are the means used by those skilled in the integrated circuit designing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "characterizing" or "switching" or "abstracting" or "applying" or "capturing" or "transitioning" or "modelling" or the like, refer to the action and processes of a computer system or similar electronic computing device, that manipulates and transforms data represented as physical (electronic) quantities within the computer system's registers and memories into other data similarly represented as physical quantities within the computer system memories or registers or other such information storage, transmission or display devices.

The present invention is discussed primarily in the context of design methodologies for integrated circuits, such as an ASIC (application specific integrated circuit) design. However, it is appreciated that the present invention can be used with other types of design methodologies for integrated circuits that have the capability to model and characterize standard cells, including but not limited to ASIC design methodologies.

EMBODIMENTS OF THE PRESENT INVENTION

The present invention provides a method that produces a more realistic modelling and characterization of the standard cell in a library. The method further provides a more accurate corner characterization of the standard cell which thereby reduces the probability of errors in silicon for designs using standard cell based methodology.

A design of an integrated circuit is comprised of interconnected elements such as, e.g., AND gates, OR gates, flip flops, multiplexers etc. These elements in combination comprise transistors. These are the elements that may make up a standard cell. The standard cells are then characterized in an abstraction in accordance with the elements contained therein and this abstraction or "circuit model" is a behavioral description of the timing data of the design. The characterization of the design is a software equivalent model with timing data which affects the transistors with regard to process variations, voltage variations, and temperature variations. As such, these variations, process, voltage, and temperature, commonly referred to as PVT variations, are the typical corners that are utilized and stated in a design. The design tools interpret this data to ensure that the design will function properly in various implementations.

Regarding voltage variations, voltage may vary due to a change in the power supply. Voltage may also vary because a portion of a circuit may suddenly draw more current. Also, voltage may vary because the power supply out is not purely conductive and therefore has resistance that will become a voltage drop such that it draws excess current. As such, the voltage would change and therefore would affect the behavior of the transistors. These variations must be abstracted into the model so that the design tools can ensure its performance. As such, the design tools should account for the variations in an anticipatory manner, such that worst and best case scenarios for the variations are considered.

These abstractions represent the best and worst "corners" that are the corners of the cell. To provide a more accurate and realistic corner characterization of a standard cell, two cell models should be utilized. One model for the best-case timing, and another model for the worst-case timing. For a worst-case timing scenario of a corner characterization of a standard cell, the circuit is characterized such that the process of the circuit is slow, from the perspective of timing. Therefore, in the worst-case scenario, the voltage is low, making the timing of the circuit slow. Further, the temperature is high, which increases resistance, which also slows the timing of the circuit. Therefore the circuit is geared toward making the transistor slower, and as such is termed the worst-case scenario, relative to PVT (process, voltage, and temperature).

For a best-case timing scenario of a corner characterization of a standard cell, the circuit is characterized such that the process of the circuit is fast, from the perspective of timing. In the best-case, the voltage is high, making the timing of the circuit fast. Further, the temperature is low, which decreases resistance, which also quickens the timing of the circuit. Therefore, the circuit is geared toward making the transistor faster, and as such is termed the best case scenario relative to PVT (process, voltage, and temperature).

It should be appreciated that by providing both a worst case scenario and a best case scenario for PVT variations, a more accurate and realistic corner characterization of standard cell is provided, such that a reduction in silicon failure is possible. Although this is an improvement over industry standards with regard to PVT variations, it is only a partial corner characterization, because non-PVT abstraction variations, specifically cross-coupling-within-the-cell variations, over-the-cell-routing variations, pin-input-capacitance variations, and delay-variation-due-to-near-simultaneous-input-switching variations have yet to be addressed or taken into account.

It should be further appreciated that the present invention further provides a method which addresses the non-PVT abstraction variations. The first non-PVT abstraction variation to be addressed is the cross-coupling-within-the-cell variation. Cross-coupling-within-the-cell variations occur when two wires, emanating from elements of the design, are disposed proximal to one another, such that capacitance is present.

FIG. 1A shows two elements of a design, in one example of one embodiment of the present invention. On the left is element 10L and on the right is element 10R. Each element has an emanating wire (EW) which is proximally disposed near the other, such that capacitance is present. In this example, the wires are switching in the same direction, indicated in each emanating wire by diagonal lines oriented in the same direction, such that the wires are mutually beneficial. As such, the wires are supportive of each other, so as to accelerate the timing, such that when wires are switching in the same direction, the timing data is appropriate for the best-case scenario.

Figure 1B:
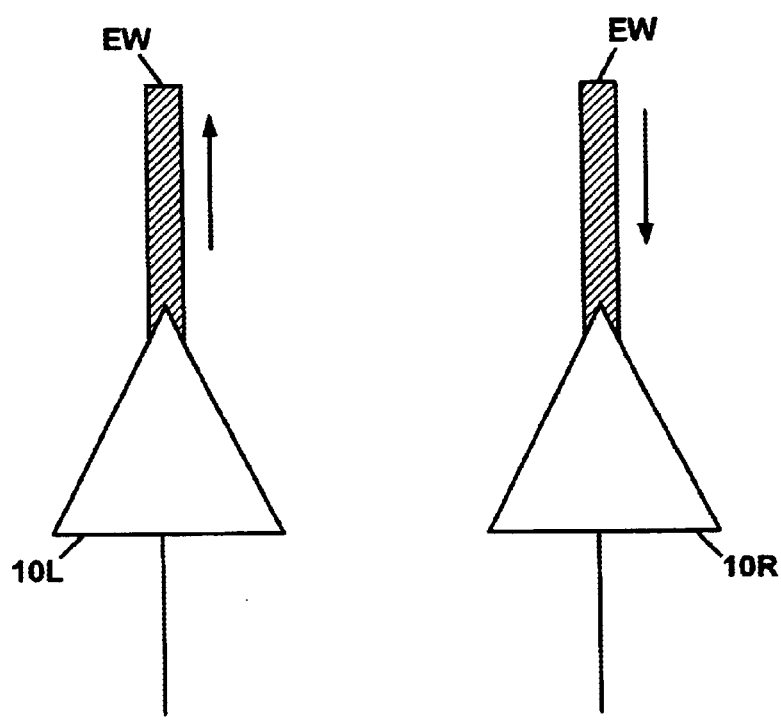
FIG. 1B is an illustration of elements of design shown as having coupling wires oriented such that they are in an opposing configuration, in accordance with one embodiment of the present invention.

FIG. 1B shows two elements of a design, in one example of one embodiment of the present invention. On the left is element 10L and on the on the right is element 10R. Each element has an emanating wire (EW) which is proximally disposed near the other, such that capacitance is present. In this example, the wires are switching in opposite directions, indicated in each emanating wire by diagonal lines oriented in opposing directions, such that the wires are not mutually beneficial. As such, the wires are non-supportive of each other, so as to slow the timing, such that when wires are switching in opposite directions, the timing data is appropriate for the worst-case scenario.

Figure 1C:
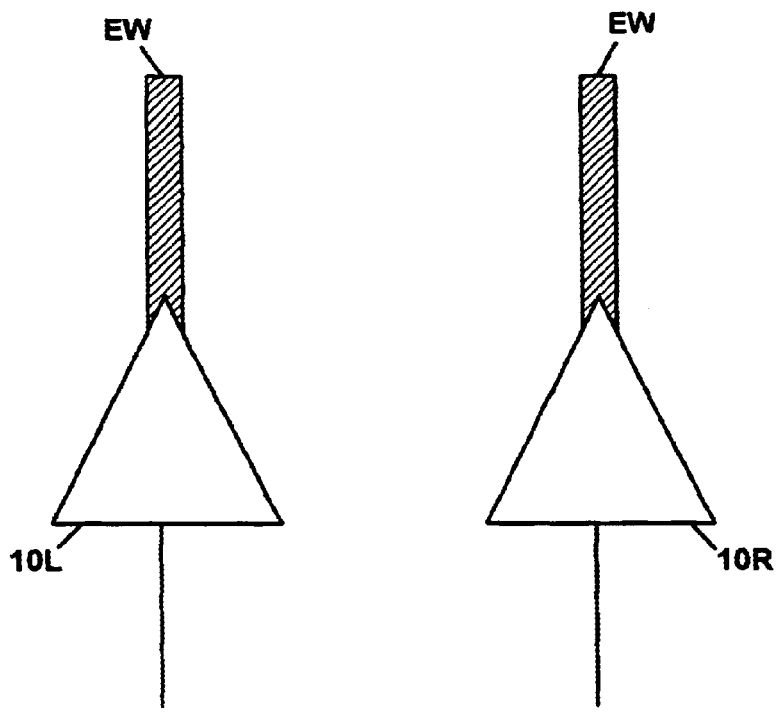
FIG. 1C is an illustration of elements of a design shown as having coupling wires that are of different sizes, such that the configuration of the larger of the wires will affect the smaller of the wires, in one embodiment of the present invention.

FIG. 1C shows two elements of a design, in one example of one embodiment of the present invention. On the left is element 10L and on the on the right is element 10R. Each element has an emanating wire (EW) which is proximally disposed near the other, such that capacitance is present. In this example, the wires are of different sizes and are switching in opposite directions, indicated in each emanating wire by diagonal lines oriented in opposing directions, such that the wires are not mutually beneficial. In this example, because the larger of the wires is in opposition to the smaller wire, the larger of the wires will affect the timing of the smaller wire, slowing the timing of the smaller wire. As such, this data would be appropriate for the worst-case scenario. It should be appreciated that had the larger wire been switching in the same direction as the smaller wire, the larger wire would affect the timing of the smaller wire, accelerating the timing of smaller wire, such that this data would be appropriate for an aggressive best-case scenario.

It should be appreciated that in IC design methodologies, a K-factor is utilized for many of the abstractions of the values necessary to perform the corner characterizations of standard cells. In one embodiment, the K-factor is the coupling factor between wires, such as those shown in FIG. 1A, 1B, and 1C. It should be further appreciated that the value may be an arbitrary value set by the designer.

With reference to FIGS. 1A, 1B, and 1C, a K-factor is utilized in the abstraction process, in one embodiment of the present invention. In FIG. 1A, because the wires are supporting each other, the K-factor has a numerical value of one, for instance. In FIG. 1B, because the wires are opposing each other, the K-factor has a numerical value of two, for instance. In FIG. 1C, because the larger wire affects the timing of the smaller wire, when the wires are opposing each other, such that the smaller wire is detrimentally affected, with regard to timing, the k-factor has a numerical value of two, for instance. In the other example in FIG. 1C, when the wires are switching in the same direction, such that the timing of the smaller wire is accelerated, considered an aggressive best-case timing scenario, the K-factor has a numerical value of 0.5, for instance.

It should be further appreciated that by providing an abstraction that includes timing variations for the cross-coupling-within-the-cell, a more realistic and accurate corner characterization of a standard cell is achieved.

The second non-PVT variation to be addressed by the present invention is the over-the-cell-routing-coupling variation. Over-the-cell-routing-coupling variations are present in designs wherein the cells are routed using metal layers. Currently, processes today cause many of these metal layers to be disposed above the cell, ranging from no layers to five layers. It should be appreciated that these layers above the cell are used for the purpose of design. Each of the layers above the cell is coupled with the one below. The wires that provide the coupling, running over the cell, cause the capacitive coupling to the internal of the cell.

It should be appreciated that when the cell is being characterized, it is not really known how that particular cell will be utilized in the design, so it is not known how many wires and what wires are above it. Currently, many ASIC extensive modelling houses or ASIC methodologies do not take into account over-the-cell-routing variations. In one example, for a worst case scenario, it is considered that all the routes are there, such that all the metal routes over the cell are actually present and being utilized. This means that the capacitive coupling is quite high and it is reflected as capacitance, thereby slowing the design, and as such, slowing the cell.

During modelling, designers layout all of the metal rods on top of the cell. This is commonly referred to as a completely full mesh of wire, and the full mesh is grounded. It should be appreciated that this is accomplished before forecasting.

Figure 2A:
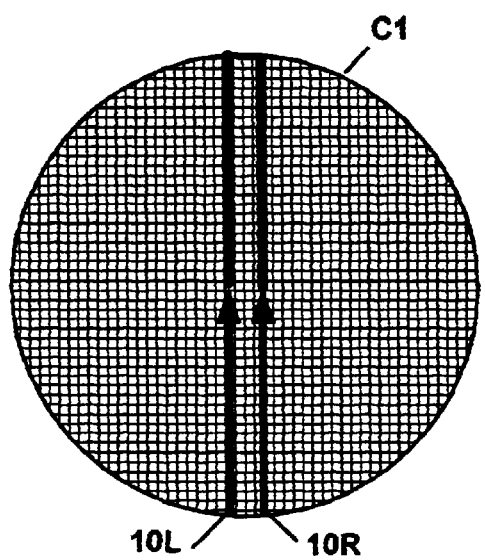
FIG. 2A is a top view illustration of elements of a design disposed upon a standard cell, in accordance with one embodiment of the present invention.

FIG. 2A is a top view illustration of a device in a designed cell C1, in one embodiment of the present invention. In this example, the cell C1 is comprised of elements 10L and 10R, analogous to 10L and 10R shown in FIGS. 1A, 1B, and 1C. Shown as disposed within cell C1 is the full mesh of wire, a see-through perspective representative of the wires that emanate from the routing layers disposed above the cell. It should be appreciated that each of the routing layers disposed above cell C1 are such that the wires of one layer are oriented perpendicular to the next layer, such that the routing layers, as viewed from above, appear as a mesh.

Figure 2B:
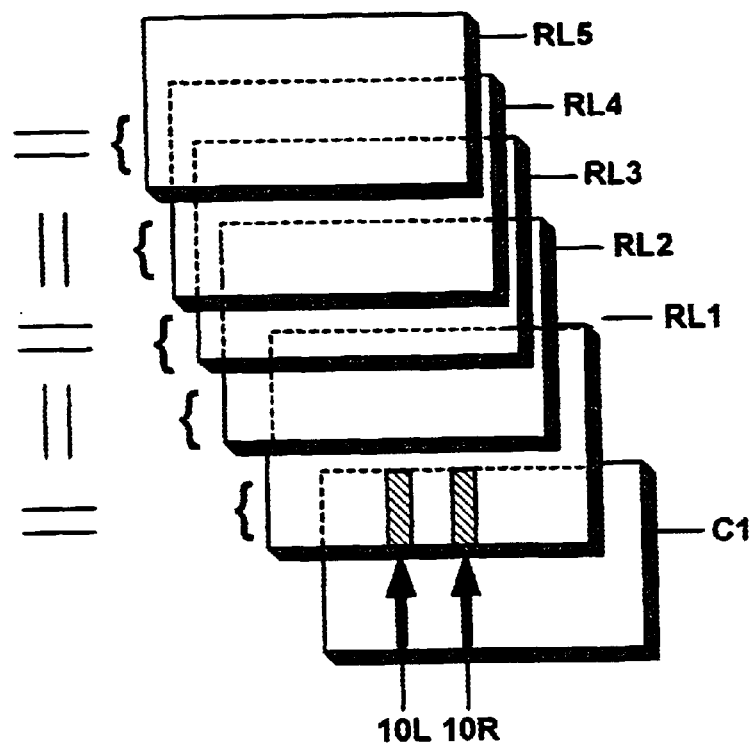
FIG. 2B is a front angled view of multiple over-the-cell-routing-layers disposed above a standard cell, in accordance with one embodiment of the present invention.

FIG. 2B is a cross-section illustrated view of FIG. 2A. Shown as disposed the bottom is device C1, analogous to device C1 of FIG. 2A. Disposed above device C1 is routing layer (RL) 1. The coupling wires of RL 1 are coupled with the internal of cell C1 in a horizontally oriented manner, shown as two horizontal lines located to the left of RL 1. Disposed above RL 1 is routing layer (RL) 2. The coupling wires of RL 2 are coupled with the internal of cell C1 in a manner perpendicular to those of RL 1, shown as two vertical lines located to the left of RL 2.

Still referring to FIG. 2B, also shown are, from bottom to top, routing layers (RL) 3, 4, and 5, respectively. Each routing layer is coupled to the internal of the cell C1 via coupling wires that are oriented perpendicular relative to the routing layer directly beneath each routing layer, such that it takes on the mesh like appearance as shown in FIG. 2A.

It is these are the over-the-cell-routing variations that are now taken into account for the best case and worst case scenarios during characterization of the standard cells. The designer utilizes layout tools or automating scripts to completely draw the grounded layout. This simulates a full mesh layering, such that all of the routes are used. It is because all these layers could be utilized for routing and all the wires have coupling capacitance that the extraction process is performed. Utilizing a standard extraction tool, e.g., spice, to extract the cell, so as to capture the capacitance between the full mesh layers and the internal of the cell, the designer extracts the capacitance of the mesh, such that a capacitance number, based upon that extraction is obtained. That extracted numerical value is then inserted into a netlist and a timing simulator is run to obtain the timing delay values and those timing delay values are then inserted into the model for the timing of the cell. The cell delay with and without the mesh are obtained as explained above.

It should be appreciated that because a maximum number of routing layers are simulated as being present, this would equate to a worst case scenario. As such, for the worst case scenario, the over-the-cell-routing variation with mesh could be used with a K-factor value of 2.0, in one embodiment of the present invention. On the other hand, to provide for a best case scenario, which would be simulated by having none of the routing layers present, in one embodiment of the present invention, would have the delay value computed without the mesh.

It should be appreciated that by providing a method of standard cell characterization that provides an abstraction that includes timing variations for over-the-cell-routing as described above, a more realistic and accurate corner characterization of a standard cell is achieved by the present invention.

The next non-PVT variation the present invention addresses is the pin-input-capacitance variation within the cell. For example, a model for a cell has timing, power, functional description, and also input capacitance. When various cells are coupled together, the cell model is enabled such that it is cognizant of how much one cell is loading another cell. At this point in modelling, the capacitance of the pin inside is irrelevant. Internal of the cell, there is timing and delay. The delay is information that is specified as propagation delay and rise and fall slope value transition times. What is relevant is the delay within the pin-input capacitance. It is this pin-input-capacitance variation that is taken into account by the present invention.

It should be appreciated that numerous factors can contribute to the variations of pin-input capacitance, and as such, timing variations. For example, input capacitance can vary in accordance with the type of transistor. Pin-input capacitance also varies depending upon the cell type and cell transition type. Additionally, input capacitance can vary when the input is rising and when the input is falling. Input capacitance also varies depending on the logic state of the cell. It should be further appreciated that the variations in the input capacitance affect the timing of the cell.

In one embodiment, the present invention includes timing variations relative to the input capacitance in the corner characterization of the standard cell. In the best-case scenario, the input capacitance is the smallest, and therefore has the least delay in timing. In the worst-case scenario, the input capacitance is the largest, and therefore has the greatest delay in timing. By capturing and including variations in input capacitance, which are therefore timing variations, the present invention provides a more accurate and realistic corner characterization of a standard cell.

The next non-PVT variation the present invention addresses is the delay due to near simultaneous input switching. It is known that multiple signals can change in what is considered a moment in time. In reality, each of the multiple signals can change at nearly the same time within that very small time window, but there is a delay between each signal change, and it is this timing variation delay that the present invention includes in the corner characterization.

Figure 3A:
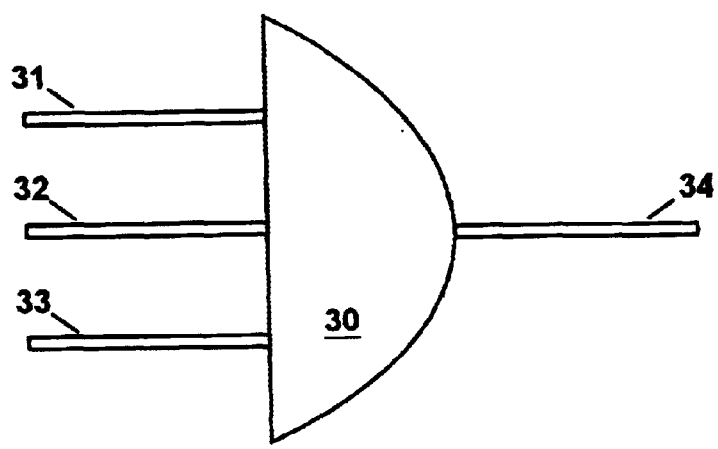
FIG. 3A is an illustration of a three input AND gate, an element of a design, in one embodiment of the present invention.

FIG. 3A is an illustration of a three input AND gate 30. The three inputs of AND gate 30 are, from top to bottom, input 31, input 32, and input 33. Also shown is output 34. In one example of one embodiment of the present invention, AND gate 30 is designed to output a one. As such, AND gate 30 will not output a one until all three inputs are ones. It is this rising transition, or in the case of a not and (NAND) gate, the falling transition, that has yet to be taken into account by current ASIC design methodologies during characterization of the cell, but which the present invention includes.

Figure 3B:
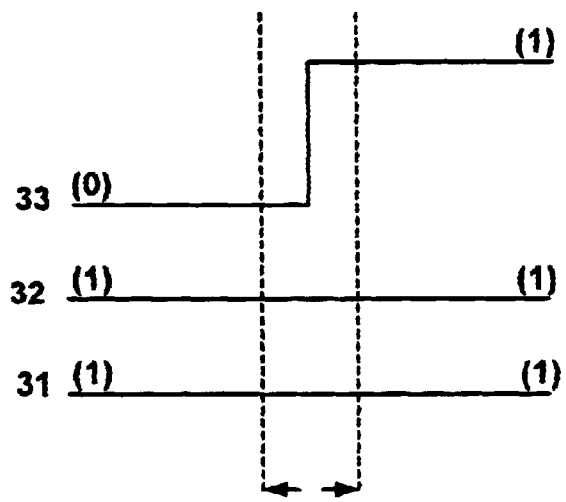
FIG. 3B is a timing diagram of the three input AND gate of FIG. 3A which depicts the timing diagram when one of the three inputs is rising (switching from zero to one), in one embodiment of the present invention.

FIG. 3B is an illustrated timing diagram of AND gate 30 of FIG. 3A which shows the timing of the inputs when inputs 31 and 32 are at one and input 33 is at zero. The delay of the and gate 30 is caused by the rising transition of input 33 from a zero to a one, shown between the dotted lines. Because, in this example, AND gate 30 requires one signal input to transition, in this instance a rising transition, the transition delay of AND gate 30 is at its least, which is therefore equated to the best-case scenario.

Figure 3C:
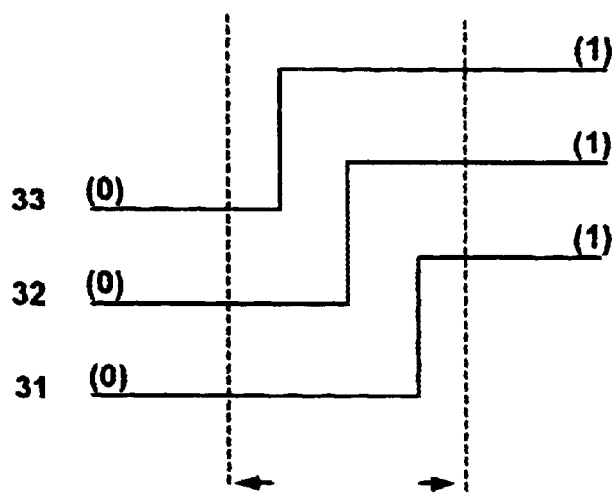
FIG. 3C is a timing diagram of the three input AND gate of FIG. 3A which depicts the timing diagram when all three inputs are rising, (switching from zero to one), in one embodiment of the present invention.

FIG. 3C is an illustrated timing diagram of AND gate 30 of FIG. 3A which shows the timing of the inputs when all three inputs, 31, 32, and 33, respectively are at zero. In this example of one embodiment of the present invention, while in the context of time the switching is almost simultaneous, but there are three distinct rising signal transitions, and as such, three distinct signal delays, shown between the dotted lines. Because each input signal must transition from a-zero to a one, this example has the largest delay, which is therefore equated to the worst-case scenario.

Figure 4A:
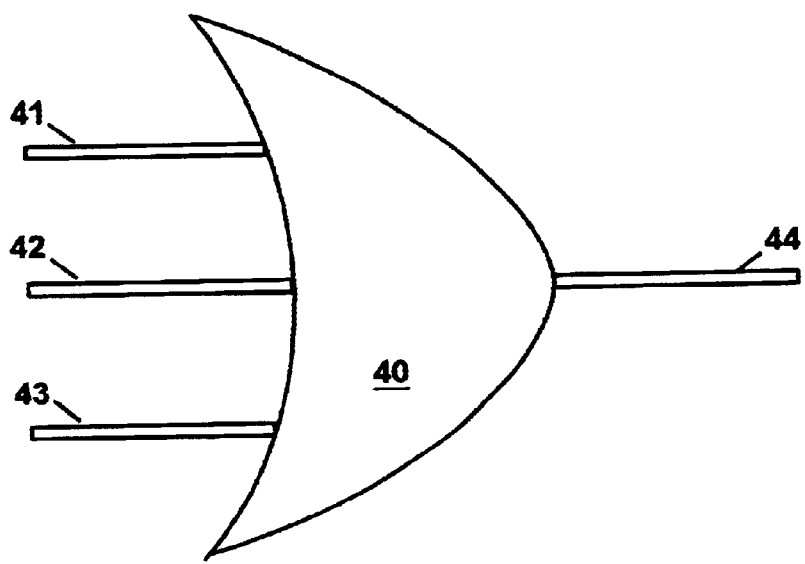
FIG. 4A is an illustration of a three input OR gate, an element of a design, in accordance with one embodiment of the present invention.

FIG. 4A is an illustration of a three input OR gate 40. The three inputs of OR gate 40 are, from top to bottom, input 41, input 42, and input 43, respectively. Also shown is output 44. In this example, OR gate 40 is designed to output a one via output 44. As such, for OR gate 40 to output a one, one of the inputs must transition from a zero to a one. It is this rising transition, or in the case of an not or (NOR) gate, the falling transition, that has yet to be taken into account by current ASIC design methodologies during characterization of the cell.

Figure 4B:
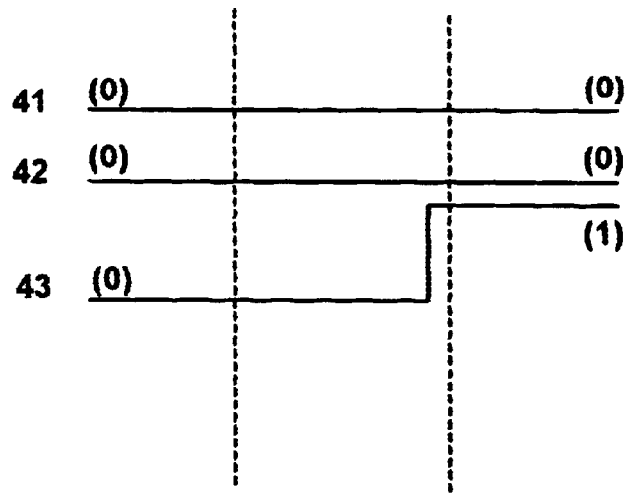
FIG. 4B is a timing diagram of the three input OR gate of FIG. 4A which depicts the timing diagram when one input is rising (switching from zero to one), in accordance with one embodiment of the present invention.

FIG. 4B is an illustrated timing diagram of OR gate 40 of FIG. 4A which shows the timing of the inputs when inputs 41, 42, and 43 are at zero. The timing delay of OR gate 40 is caused by the rising transition of input 43 from a zero to a one, shown between the dotted lines. Although OR gate 40 needs only one signal input to transition from a zero to a one, this example has the largest delay. This is based upon an assumption that the order for the transitioning inputs is unknown, thus for the worst-case scenario, the transitioning input signal to OR gate 43 may be the last input signal. By utilizing a delay value relative to the last input signal, so as to have the largest delay, the timing delay is therefore equated to the worst-case scenario.

Figure 4C:
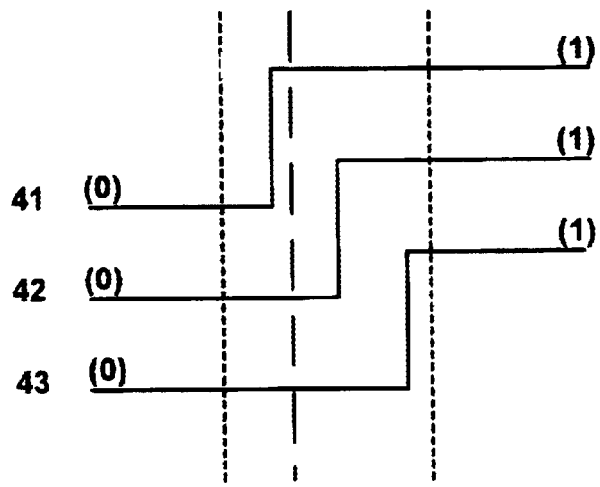
FIG. 4C is an illustration of the timing signal of the three input OR gate of FIG. 4A which depicts the timing diagram when all three inputs are rising (switching from zero to one), in accordance with one embodiment of the present invention.

FIG. 4C is an illustrated timing diagram of OR gate 40 of FIG. 4A which shows the timing of the inputs when all three inputs, 41, 42, and 43, respectively are at zero. In this example of one embodiment of the present invention, whereas in the context of time the switching is almost simultaneous, but there are three distinct rising signal transitions, and as such, three distinct signal delays, shown between the dotted lines. Even though each input signal must transition from a zero to a one, this example has the smallest delay. This is based upon the fact that the first input signal that transitions from a zero to a one, in this instance input 41, will, in fact, cause the output of OR gate 40 to change form a zero to a one, which is therefore equated to the best-case scenario.

It should be further appreciated that in one embodiment, the delay representations can include K-factors having numerical equivalents as described above. In another embodiment, the delay representations can include actual timing values. In yet another embodiment, the delay representation can include a combination of K-factors and actual timing variations.

It should be appreciated that in FIGS. 3A–3C and FIGS. 4A–4C, three input AND and OR gates, respectively, are used for illustrative purposes. However, these illustrations should not be construed as limitations, but as examples of the present invention. It should be further appreciated that the present invention may be implemented for use with most devices or elements having nearly any number of signal inputs.

Therefore, in the present embodiment of the present invention, because the present invention's method for corner characterization includes capturing timing variations for pin-input-capacitance and delays to due near simultaneous input switching in the characterization process, a more accurate and realistic corner characterization of a standard cell is achieved, so as to reduce possible silicon failures.

With reference to interdependent setup-hold-delay variations regarding sequential cells, the present invention provides a method to optimally obtain these values. Because sequential cells are interrelated to each other, it is important to reflect the relationship between the sequential cells.

Figure 5:
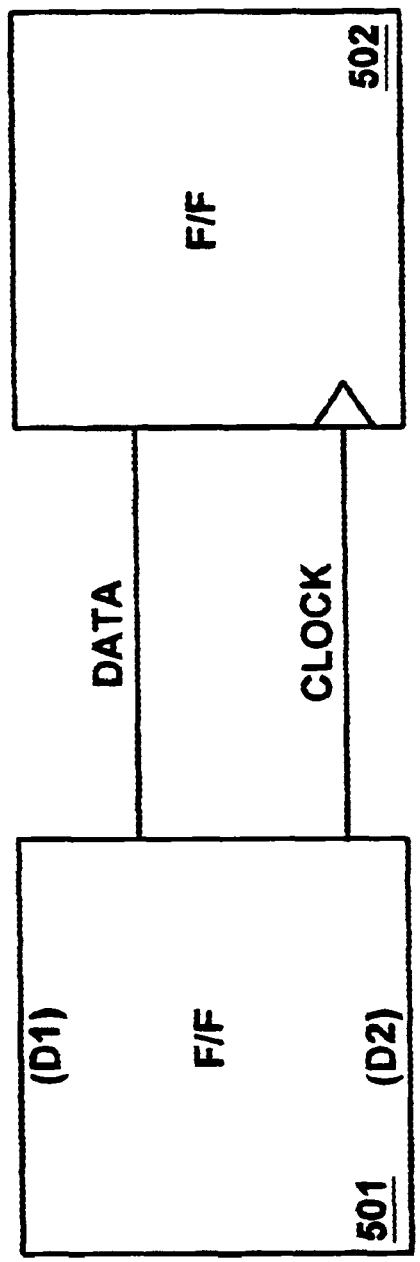
FIG. 5 is an illustration of sequential cells, elements in a design, in accordance with one embodiment of the present invention.

For example, in FIG. 5, in one embodiment of the present invention, sequential cells may be two flip-flops, 501 and 502, respectively, coupled together. In this example, the output of the second flip-flop 502 is contingent upon receiving input from the first sequential cell's output.

It should be appreciated that including variations for interdependent set up, hold, and delays in corner characterization provide an accurate best and worst case timing scenario for sequential cells is important for performing verification as to whether there are any hold violations in the design.

Still referring to FIG. 5, to illustrate the best-case scenario, in one example of one embodiment of the present invention, flip-flops 501 and 502 are coupled with each other, and provided there is some logic between them, there is a delay. The data (D1) contained within the first flip-flop was setup long before the actual setup drawing, and because the delay is a function of how long ago the data was setup, this delay can be small. Therefore, to account for this scenario, the present invention captures this timing variation to acquire the hold values for infinite setup, such that the infinite data setup uses the smallest delay.

Accordingly, by virtue of the delay through the sequential cells is measured with infinite set up time with respect to a clock signal, this scenario equates to the best-case timing scenario regarding interdependent set up, hold and delay variations for sequential cells.

Still referring to FIG. 5, to illustrate the worst-case scenario, in another example of one embodiment of the present invention, flip-flops 501 and 502 are coupled with each other, and provided there is some logic between them, there is a delay. However, in this example, the data (D2) is set up just prior to the clock signal, such that the data is held for the minimum allowed setup time.

Accordingly, by virtue of the delay through the sequential cells being measured as having minimum set up time with respect to a clock signal, this scenario equates to the worst-case timing scenario regarding interdependent set up, hold and delay variations for sequential cells.

Figure 6:
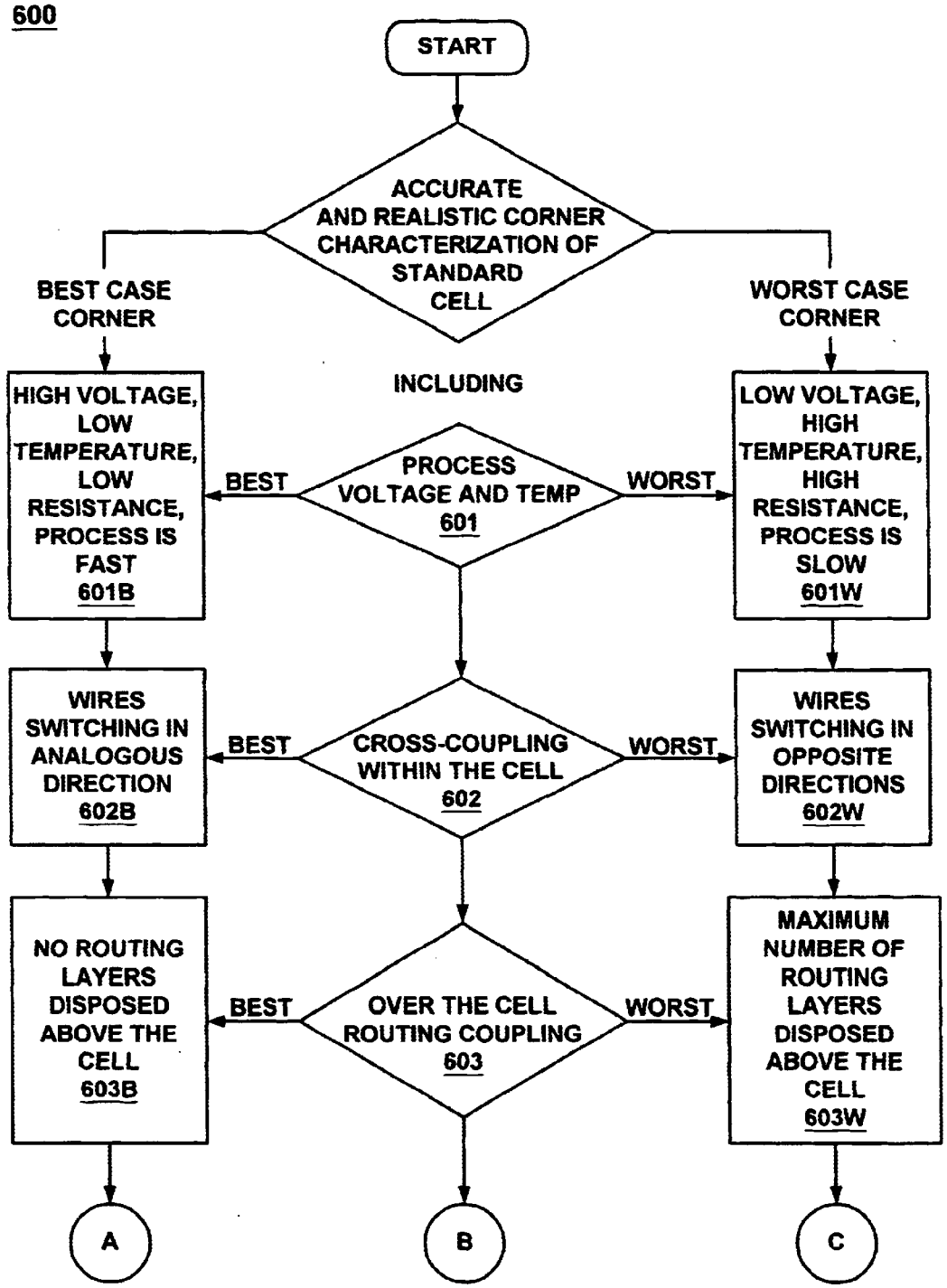
FIG. 6 is a flowchart showing the steps of a method 800 for a more accurate and realistic cell corner characterization of a standard cell, in accordance with one embodiment of the present invention.
Figure 6:
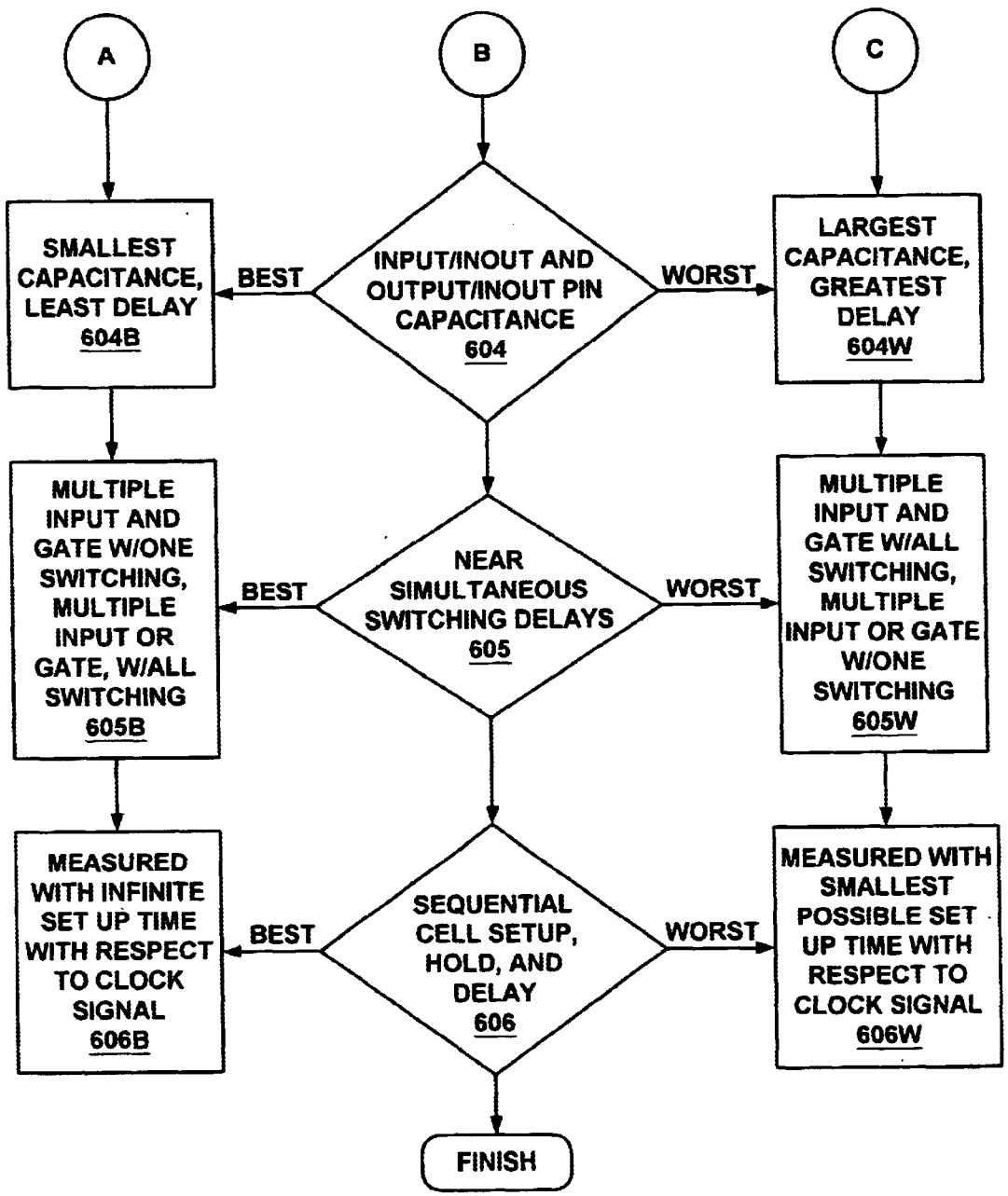

FIG. 6 is a flow chart showing the steps in a process 600 for a method for providing a more accurate and realistic corner characterization of standard cells in accordance with the present invention. In the present embodiment, a best-case timing scenario and a worst-case timing scenario are provided, so as to more accurately represent the extremes of the cell with respect to corner characterization.

In Step 601, in one embodiment of corner characterization, the present invention includes in a circuit model the actual values regarding variations of cell PVT (process, voltage, and temperature) for the standard cell being examined. These variations in PVT affect the timing of the cell. When these variations are captured from the cell, depending on the results, they are deemed to either be a best-case or a worst-case.

In Step 601B, the best-case scenario, the circuit is characterized such that the voltage is high, the temperature and resistance are low, and as such the cell process is fast. Therefore, in this instance, the circuit is geared toward making the transistor faster, and as such, is considered to be the best-case scenario regarding cell PVT. The circuit model is updated.

In Step 601W, the worst-case scenario, the circuit is characterized such that the voltage is low, the temperature and resistance are high, and as such the cell process is slow. Therefore, in this instance, the circuit is geared toward making the transistor slower, and as such, is considered to be the worst-case scenario regarding cell PVT. The circuit model is updated.

In Step 602, in one embodiment of corner characterization, the present invention further includes capturing timing variations regarding cross-coupling within the cell. Cross-coupling occurs when two wires, emanating from elements of a design, are proximally disposed, such that capacitance is present.

In Step 602A, the best-case scenario, the wires emanating from the elements in a design, as described in FIG. 1A, are such that they are switching in an analogous direction, and as such are mutually beneficial. In this instance, the wires are supportive of each other, and may therefore accelerate the timing. Accordingly, when wires switch in an analogous direction, it is deemed a best-case scenario and therefore a K-factor of 1.0 is utilized during the cell characterization process. The circuit model is updated.

In Step 602B, the worst-case scenario, the wires emanating from the elements in a design, as described in FIG. 1B, are such that the wires are switching in opposing directions, and as such are not mutually beneficial. In this instance, the wires are hindering each other, and may therefore slow the timing. Accordingly, when wires switch in opposing directions, it is deemed a worst-case scenario and therefore a K-factor of 2.0 is utilized during the cell characterization process. The circuit model is updated.

In Step 603, in one embodiment of corner characterization, the present invention further includes capturing timing variations regarding over the cell routing coupling. As described in FIGS. 2A and 2B, over the cell routing coupling pertains to metal layers, that may range from having no layers to a current maximum of five layers and which are used for the purpose of design, that are disposed above the cell. Each of the layers above the cell is coupled with the layer beneath. The wires that provide the coupling, running over the cell, cause the capacitive coupling to the internal of the cell, and as such affect the timing.

In Step 603B, the best-case scenario, the cell is such that there are no routing coupling layers disposed above. Because there are no layers, there is a minimum of, if any, capacitance, and this is therefore considered to be the best-case scenario for over the cell routing. The circuit model is updated.

In Step 603W, the worst-case scenario, the cell is such that there are a maximum number of routing coupling layers disposed above. Because there are a maximum number of layers, there is a maximum amount of capacitance, and therefore, this is considered to be the worst-case scenario for over the cell routing. The circuit model is updated.

In Step 604, in one embodiment of corner characterization, the present invention further includes capturing of the timing variations regarding input/inout and output/inout pin capacitance.

In Step 604B, the best-case scenario, the capacitance is the least, such as for example, when a transistor has less capacitance, or when the physical properties of a cell type are such that there is a minimum of capacitance, such that the timing is faster, these timing variations are considered as a best-case timing scenario. The circuit model is updated.

In Step 604W, the worst-case scenario, when the capacitance is the greatest, such as for example, when a transistor has more capacitance, or when the physical properties of a cell type are such that there is a maximum of capacitance, such that the timing is slower, these timing variations are considered as a worst-case scenario. The circuit model is updated.

In Step 605, in one embodiment, the present invention further includes capturing timing variations regarding near simultaneous switching delays which occur when input signals, rising or falling, cause a change in the output of a device of element.

In Step 605B, the best-case scenario, occurs when a multiple input and gate is transitioning from one state to another, where the other inputs have already transitioned, such that a single input transition is required to facilitate the change in the output, so as to have a delay for only one signal input transition, as is described in FIG. 3B. The best-case scenario also occurs when a multiple input or gate is transitioning from one state to another, and those inputs are all transitioning, so as to change the output, such that any of the transitioning signal inputs cause the change in output, as is described in FIG. 4C. Accordingly, because the delay is less in these variations, these timing variations are considered the best-case scenario. The circuit model is updated.

In Step 605W, the worst-case scenario, occurs when a multiple input and gate is transitioning from one state to another, where none of the inputs have already transitioned, such that because all signal input transitions are required to facilitate the change in the output, there is a delay for each of the signal input transitions, thereby having a greater delay, as is described in FIG. 3C. The worst-case scenario also occurs when a multiple input or gate is transitioning from one state to another, and a single input is transitioning, so as to change the output, that because the signal input transition may be the last of the inputs to transition, a greater delay is realized, as is described in FIG. 4B. Accordingly, because the delay is greater in these variations, these timing variations are considered the worst-case scenario. The circuit model is updated.

In Step 606, in one embodiment, the present invention further includes capturing timing variations regarding interdependent set up, hold, and delays for sequential cells, which occur when the output of a second cell is contingent upon receiving input from the output of a first cell, such that the time the data is held is variable, as described in FIG. 5.

In Step 606B, the best-case scenario occurs when the data, held in the first sequential cell, was set up long before being outputted to the input of a second sequential, such that a minimum delay is present. The circuit model is updated.

In Step 606W, the worst-case scenario occurs when the data, not present in the first sequential cell, is set up just prior to being outputted to the input of a second sequential, and as such, a greater delay occurs by virtue of the second sequential cell having to wait for the data to be set up in the first sequential cell. The circuit model is updated.

It should be appreciated that, in one embodiment of the present invention, the above described timing variation values, which are load values of the model, are scaled by a K-factor to time units, and these values become part of the netlist, which is then entered into the spice as capacitance values. The timing simulations then return timing numbers. The returned numbers are put into the model, and then abstracted into the best-case and worst-case corner of the cell being characterized. Process 600 is run for each standard cell to obtain an accurate model for each.

Figure 7:
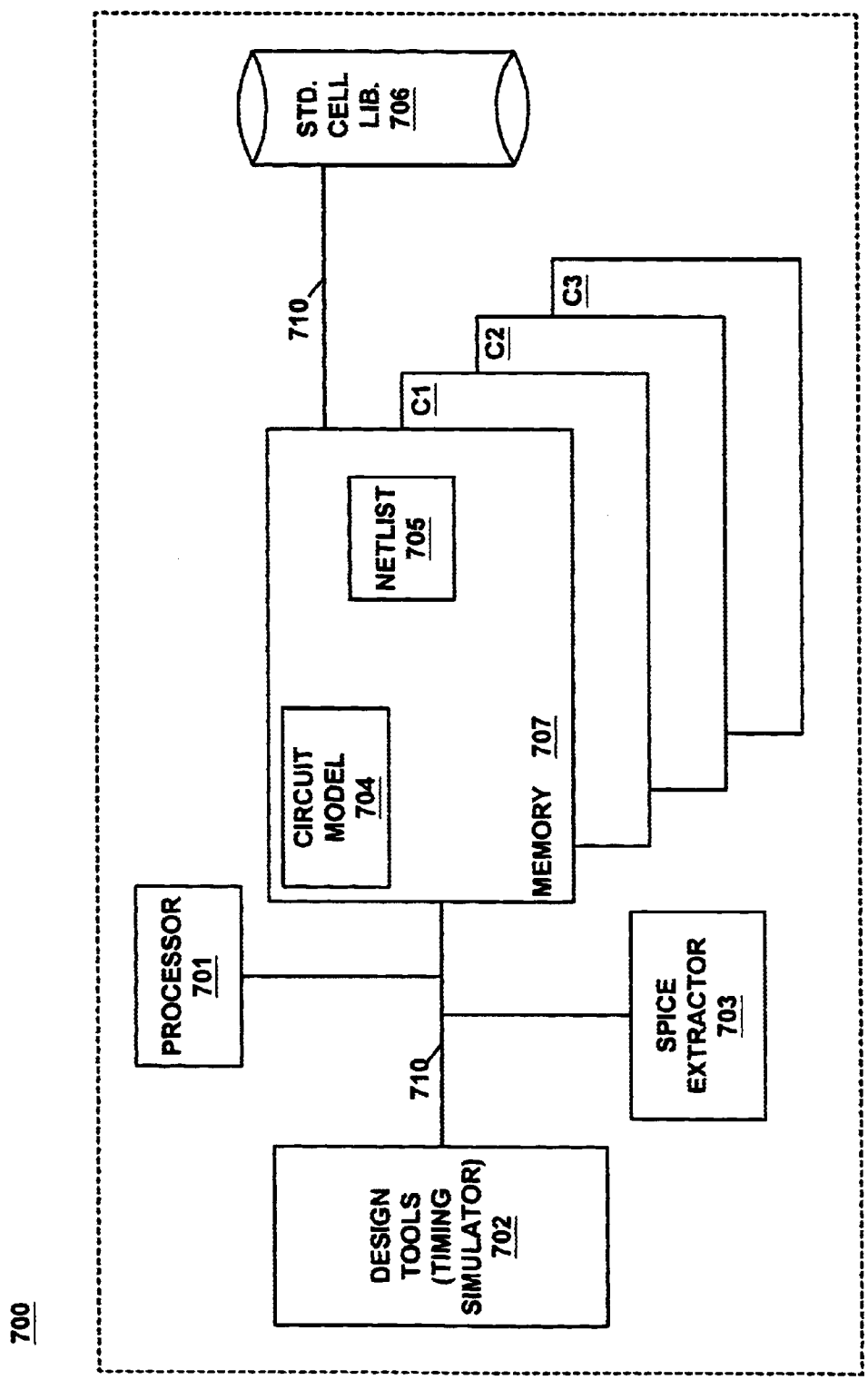
FIG. 7 is a block diagram of one embodiment of a computer system in accordance with the present invention.

FIG. 7 is a block diagram of a computer system 700 with which process 600 may be run, in one embodiment of the present invention. Computer system 700 includes address/data bus 710 for communicating information, a processor 701 coupled with the bus for processing information and instructions, a memory 707 coupled to the bus for storing information and instructions for the processor. Computer system 700 also includes design tools (timing simulator) 702 coupled to the bus for providing two and three dimensional geometric models of transistors to predict capacitance (timing). Further included in computer system 700 is standard cell libraries 706 coupled to the bus for providing computer models of cells (predefined logic elements). Also included in computer system 700 is spice extractor 703, coupled to the bus, for providing circuit models which are utilized to verify the cell library.

Still referring to FIG. 7, in one embodiment of the present invention, cells C1, C2, and C3 are accessed from standard cell libraries 706 and loaded into memory 707. The cells are abstracted into the netlist 705. Subsequently, netlist 705 containing cells C1–C3 includes the interconnections of the cells and is then used to simulate a circuit, in this example, circuit model 704.

It should be appreciated that in this embodiment, computer system has design tools 702, spice extractor 703 and standard cell libraries 706 disposed internally. However, in another embodiment, design tools 702, spice extractor 703, and standard cell libraries 706 may be disposed external to computer system 700. In such an instance, computer system 700 would access design tools 702, spice extractor 703, and standard cell libraries 706 via normal communication connections such as, e.g., parallel, serial, USB, Firewire, and the like, or access could be via a wireless communication connection, if computer system 700 is so configured.

It should be further appreciated that this new methodology for cell timing characterization improves the worst-case and best-case timing modelling for the cells in a standard cell library. The inclusion of more accurate best and worst case timing modellings provides a more accurate and realistic corner characterization of the cell. This thereby reduces the probability of errors in silicon and thus enables the designers to reduce the guard band required to produce successful designs using standard cell libraries.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory resident circuit cell model for use by design tools for characterizing an integrated circuit cell, said circuit cell model comprising:
   a first aggregate value representing a best case corner; and
   a second aggregate value representing a worst case corner; wherein said first aggregate value and said second aggregate value comprise:
      a first delay representation accounting for timing variations of said circuit cell relative to cross-coupling within the circuit cell; and
      a second delay representation accounting for timing variations of said circuit cell relative to over-the-cell routing coupling.

2. The memory resident circuit cell model of claim 1 wherein said first aggregate value and said second aggregate value further comprise:
   a third delay representation accounting for timing variations of said circuit cell relative to input capacitance for input/output pins;
   a fourth delay representation accounting for timing variations of said circuit cell relative to delays due to near simultaneous input switching variations.

3. The memory resident circuit cell model of claim 2 wherein said first aggregate value and said second aggregate value further comprise:
   a fifth delay representation accounting for timing variations of said circuit cell relative to interdependent set up and hold and delay variations for sequential cells.

4. The memory resident circuit cell model of claim 3 Wherein said fifth delay representation is a best case value when delay through said sequential cell is measured with an infinite set up time with respect to a clock signal, and wherein said fifth delay representation is a worst case value when delay through said sequential cell is measured with an insufficient set up time with respect to a clock signal.

5. The memory resident circuit cell model of claim 2 wherein said third delay representation is a best case value when said input capacitance is smallest, and wherein third delay representation is a worst case value when said input capacitance is largest.

6. The memory resident circuit cell model of claim 2 wherein said fourth delay representation is a best case value when said input switching occurs during a single input transition in a device having multiple inputs, wherein said transition causes a change in output of said device, wherein said device is an AND gate, and when said input switching occurs during multiple input transitions in a device having multiple inputs, wherein said transition causes a change in output of said device, wherein said device is an OR gate, and wherein said fourth delay representation is a worst case value is when said input switching occurs during multiple input transitions in a device having multiple inputs, wherein said transition causes a change in output of said device, wherein said device is an AND gate, and when said input switching occurs during a single input transition in a device having multiple inputs, wherein said transition causes a change in output of said device, wherein said device is an OR gate.

7. The memory resident circuit cell model of claim 1 wherein said first delay representation is a best case value when wires that provide said cross-coupling are proximally oriented and said wires are supportive of each other, provided said wires switch in an analogous direction, and wherein said first delay representation is a worst case value when said wires that provide said cross-coupling said proximally oriented are hindering of each other, provided said wires are switching in an opposite direction.

8. The memory resident circuit cell model of claim 1 wherein said second delay representation is a best case value when no routing layers are disposed above said circuit cell, and wherein said second delay representation is a worst case value when a maximum number of routing layers are disposed above said circuit cell.

9. A memory resident circuit cell model for use by design tools for characterizing an integrated circuit cell, said circuit cell model comprising:
   a first aggregate value representing a best case corner; and
   a second aggregate value representing a worst case corner; wherein said first aggregate value and said second aggregate value comprise:
      a first delay representation accounting for timing variations of said circuit cell relative to input capacitance of input/output pins; and
      a second delay representation accounting for timing variations of said circuit cell relative to interdependent set up and hold and delay variations for sequential cells.

10. The memory resident circuit cell model of claim 9 wherein said first aggregate value and said second aggregate value further comprise:
    a third delay representation accounting for timing variations of said circuit cell relative to cross-coupling within the circuit cell; and
    a fourth delay representation accounting for timing variations of said circuit cell relative to over-the-cell routing coupling.

11. The memory resident circuit cell model of claim 10 wherein said third delay representation is a best case value when wires that provide said cross-coupling are proximally oriented and said wires are supportive of each other, provided said wires switch in an analogous direction, and wherein said third delay representation is a worst case value when said wires that provide said cross-coupling said proximally oriented are hindering of each other, provided said wires are switching in an opposite direction.

12. The memory resident circuit cell model of claim 10 wherein said fourth delay representation is a best case value when no routing layers are disposed above said circuit cell, and wherein said fourth delay representation is a worst case value when a maximum number of routing layers are disposed above said circuit cell.

13. The memory resident circuit cell model of claim 9 wherein said first aggregate value and said second aggregate value further comprise:
    a fifth delay representation accounting for timing variations of said circuit cell relative to delays due to near simultaneous input switching variations.

14. The memory resident circuit cell model of claim 13 wherein said fifth delay representation is a best case value when said input switching occurs during a single input transition in a device having multiple inputs, wherein said transition causes a change in output of said device, wherein said device is an AND gate, and when said input switching occurs during multiple input transitions in a device having multiple inputs, wherein said transition causes a change in output of said device, wherein said device is an OR gate, and wherein said fifth delay representation is a worst case value is when said input switching occurs during multiple input transitions in a device having multiple inputs, wherein said transition causes a change in output of said device, wherein said device is an AND gate, and when said input switching occurs during a single input transition in a device having multiple inputs, wherein said transition causes a change in output of said device, wherein said device is an OR gate.

15. The memory resident circuit cell model of claim 9 wherein said first delay representation is a best case value when said input capacitance is smallest, and wherein said first delay representation is a worst case value when said input capacitance is largest.

16. The memory resident circuit cell model of claim 9 wherein said second delay representation is a best case value when delay through said sequential cell is measured with an infinite set up time with respect to a clock signal, and wherein said second delay representation is a worst case value when delay through said sequential cell is measured with an insufficient set up time with respect to a clock signal.

17. A memory resident circuit cell model for use by design tools for characterizing an integrated circuit cell, said circuit cell model comprising:
    a first aggregate value representing a best case corner; and
    a second aggregate value representing a worst case corner; wherein said first aggregate value and said second aggregate value comprise:
        a first delay representation accounting for timing variations of said circuit cell relative to delays due to near simultaneous input switching variations; and
        a second delay representation accounting for timing variations of said circuit cell relative to cross-coupling within the circuit cell.

18. The memory resident circuit cell model of claim 17 wherein said first aggregate value and said second aggregate value further comprise:
    a third delay representation accounting for timing variations of said circuit cell relative to interdependent set up and hold and delay variations for sequential cells; and
    a fourth delay representation accounting for timing variations of said circuit cell relative to input capacitance.

19. The memory resident circuit cell model of claim 18 wherein said third delay representation is a best case value when delay through said sequential cell is measured with an infinite set up time with respect to a clock signal, and wherein said third delay representation is a worst case value when delay through said sequential cell is measured with an insufficient set up time with respect to a clock signal.

20. The memory resident circuit cell model of claim 18 wherein said fourth delay representation is a best case value when said input capacitance is smallest, and wherein said fourth delay representation is a worst case value when said input capacitance is largest.

21. The memory resident circuit cell model of claim 17 wherein said first aggregate value and said second aggregate value further comprise;
    a fifth delay representation accounting for timing variations of said circuit cell relative to over-the-cell routing coupling.

22. The memory resident circuit cell model of claim 19 wherein said fifth delay representation is a best case value when no routing layers are disposed above said circuit cell, and wherein second delay representation is a worst case value when a maximum number of routing layers are disposed above said circuit cell.

23. The memory resident circuit cell model of claim 17 wherein said first delay representation is a best case value when said input switching occurs during a single input transition in a device having multiple inputs, wherein said transition causes a change in output of said device, wherein said device is an AND gate, and when said input switching occurs during multiple input transitions in a device having multiple inputs, wherein said transition causes a change in output of said device, wherein said device is an OR gate, and wherein said first delay representation is a worst case value is when said input switching occurs during multiple input transitions in a device having multiple inputs, wherein said transition causes a change in output of said device, wherein said device is an AND gate, and when said input switching occurs during a single input transition in a device having multiple inputs, wherein said transition causes a change in output of said device, wherein said device is an OR gate.

24. The memory resident circuit cell model of claim 17 wherein said second delay representation is a best case value when wires that provide said cross-coupling are proximally oriented and said wires are supportive of each other, provided said wires switch in an analogous direction, and wherein said fifth delay representation is a worst case value when said wires that provide said cross-coupling said proximally oriented are hindering of each other, provided said wires are switching in an opposite direction.

* * * * *